(12) United States Patent
Fukaura

(10) Patent No.: US 6,613,645 B2
(45) Date of Patent: Sep. 2, 2003

(54) METHOD OF MANUFACTURING SEMICONDUCTOR DEVICE WITH GLUE LAYER IN OPENING

(75) Inventor: Yasuhiro Fukaura, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/085,080

(22) Filed: Mar. 1, 2002

(65) Prior Publication Data

US 2002/0089035 A1 Jul. 11, 2002

Related U.S. Application Data

(62) Division of application No. 09/492,535, filed on Jan. 27, 2000, now abandoned.

(30) Foreign Application Priority Data

Jan. 26, 1999 (JP) ............................................. 11-016819

(51) Int. Cl.[7] .............................................. H01L 21/76
(52) U.S. Cl. ...................... 438/424; 438/637; 438/638; 438/700; 257/510
(58) Field of Search .................................. 438/637–640, 438/672–675, 197, 362, 363, 424

(56) References Cited

U.S. PATENT DOCUMENTS 5,683,924 A * 11/1997 Chan et al. .................. 438/197
5,930,620 A    7/1999 Wristers et al. ............. 438/243

\* cited by examiner

*Primary Examiner*—D Le
(74) *Attorney, Agent, or Firm*—Pillsbury Winthrop LLP

(57) ABSTRACT

The present invention provides a structure in which a glue layer is formed on an active area and a shallow trench isolation with a glue layer interposed therebetween. A P-type silicon substrate includes the active area partitioned by the shallow trench isolation. An $N^+$-type semiconductor region is formed in the active area. An interlayer insulation film is formed on the shallow trench isolation and active area, and has an opening to which the shallow trench isolation, active area, and a boundary between them are exposed. A glue layer is formed in the opening. Local interconnect wiring is formed in the opening and electrically connected to the $N^+$-type semiconductor region through the glue layer. The active area overlaps the shallow trench isolation, and the glue layer has a portion opposed to the $N^+$-type semiconductor region through the shallow trench isolation underlying the overlap of the active area.

11 Claims, 5 Drawing Sheets

METHOD OF MANUFACTURING SEMICONDUCTOR DEVICE WITH GLUE LAYER IN OPENING

CROSS REFERENCE TO RELATED APPLICATION

The subject matter of the present application is a divisional of the application Ser. No. 09/492,535 filed on Jan. 27,. 2000, now abandoned.

BACKGROUND OF THE INVENTION

The present invention relates to a semiconductor integrated circuit device and, more specifically, to a structure of an active area, a shallow trench isolation, and a conductor formed on the active area and the shallow trench isolation via a glue layer.

FIG. 1 is a cross-sectional view showing a prior art semiconductor integrated circuit device.

The device of FIG. 1 includes two adjacent active areas (AA) 104 between which a shallow trench isolation (STI) 103 is interposed. An $N^+$-type semiconductor region 105 is formed in one of the active areas 104, and a $P^+$-type semiconductor region 106 is formed in the other active area 104. An opening 113 is formed in a first interlayer insulation film 112. The shallow trench isolation 103, $N^+$-type semiconductor region 105 and $P^+$-type semiconductor region 106 are exposed to the bottom of the opening 113. A glue layer 114 is formed in the opening 113. The opening 113 is filled with a conductor 115 which is electrically connected to the regions 105 and 106 through the glue layer 114. The conductor 115 connects the regions 105 and 106 above the shallow trench isolation 103.

In the structure of the prior art device shown in FIG. 1, the glue layer 114 is brought into direct contact with both the $N^+$- and $P^+$-type semiconductor regions 105 and 106 in the opening 113. If, therefore, a defect 200 is caused in the active area 104 so as to extend from the region 105 and reach a substrate 101 through a PN junction, a conductor constituting the glue layer 114, such as titanium (Ti), is diffused along the defect 200 by a heating step of a manufacturing process, and a Ti-silicide layer will be formed through the PN junction. As a result, a leak (junction leak) is increased remarkably in the PN junction.

The increase in junction leak increases power consumption and causes malfunction, which lowers the reliability of the device and decreases the manufacturing yield thereof.

BRIEF SUMMARY OF THE INVENTION

A method of manufacturing a semiconductor device according to a first aspect of the inventions described herein includes: forming an element isolation region in a semiconductor substrate isolating an active area in the substrate; causing the active area to overlap the element isolation region; forming a metal layer on the active area; reacting the metal layer to the active area to form an interlayer insulation film on the element isolation region and a reaction layer of the metal layer; forming an opening in the interlayer insulation film, the opening being exposed to the element isolation region and the reaction layer; forming a glue layer in the opening; and forming a conductor electrically connected to the active area via the glue layer.

A method of manufacturing a semiconductor device according to a second aspect of the inventions includes: forming an element isolation region in a silicon semiconductor substrate of a first conductivity type isolating an active area in the semiconductor substrate; forming a semiconductor region of a second conductivity type in the active area; exposing a top surface and a side of the active area; forming silicon layer on the top surface and the side of the active area and overlapping the element isolation region by selective epitaxial growth; forming an interlayer insulation film on the element isolation region and the silicon layer; forming an opening to which the element isolation region, the silicon layer, and a boundary therebetween are exposed; forming a glue layer in the opening; and forming a conductor electrically connected to the semiconductor region through the glue layer.

A method of manufacturing a semiconductor device according to a third aspect of the inventions includes: forming an element isolation region in a semiconductor substrate of a first conductivity type isolating an active area in a silicon semiconductor substrate; forming a semiconductor region of a second conductivity type in the active area; exposing a top surface of the active area; forming, in the element isolation region, a hollow to which a side of the active area is exposed; burying silicon layer in the hollow; forming an interlayer insulation film on the element isolation region and the silicon layer; forming an opening to which the element isolation region, the silicon layer and a boundary there between are exposed; forming a glue layer in the opening; and forming a conductor electrically connected to the semiconductor region through the glue layer.

A method of manufacturing a semiconductor device according to a fourth aspect of the inventions includes: forming an element isolation region in a semiconductor substrate of a first conductivity type isolating an active area in the semiconductor substrate; forming a semiconductor region of a second conductivity type in the active area; causing the active area to overlap the element isolation region; forming a metal layer at least on the active area after the active area is caused to overlap the element isolation region causing the metal layer to react on the active area to form a reaction layer of metal containing the metal layer and a semiconductor containing the active area; removing an unreacted portion of the metal layer to leave the reaction layer on a surface of the semiconductor region of the second conductivity type formed in the active area; forming an interlayer insulation film on the element isolation region and the reaction layer; forming an opening to which the element isolation region, the reaction layer, and a boundary therebetween are exposed; forming a glue layer in the opening; and forming conductor electrically connected to the semiconductor region through the glue layer.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
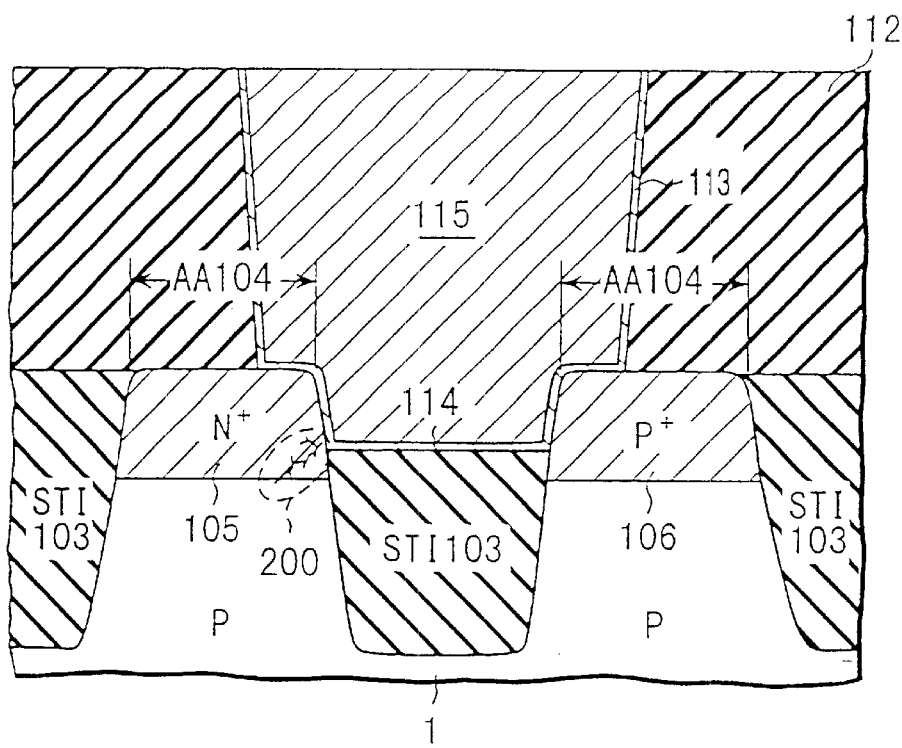
FIG. 1 is a cross-sectional view of a prior art semiconductor integrated circuit device.

Embodiments of the present invention will now be described with reference to the accompanying drawings. The elements common to all the drawings are indicated by the same reference numerals.

First Embodiment

First the basic structure of the present invention will be described as a first embodiment.

The first embodiment is directed to an example of a local interconnection (hereinafter referred to as LI wiring) for interconnecting adjacent $N^+$- and $P^+$-type semiconductor regions between which a shallow trench isolation (STI) is sandwiched.

Figure 2:
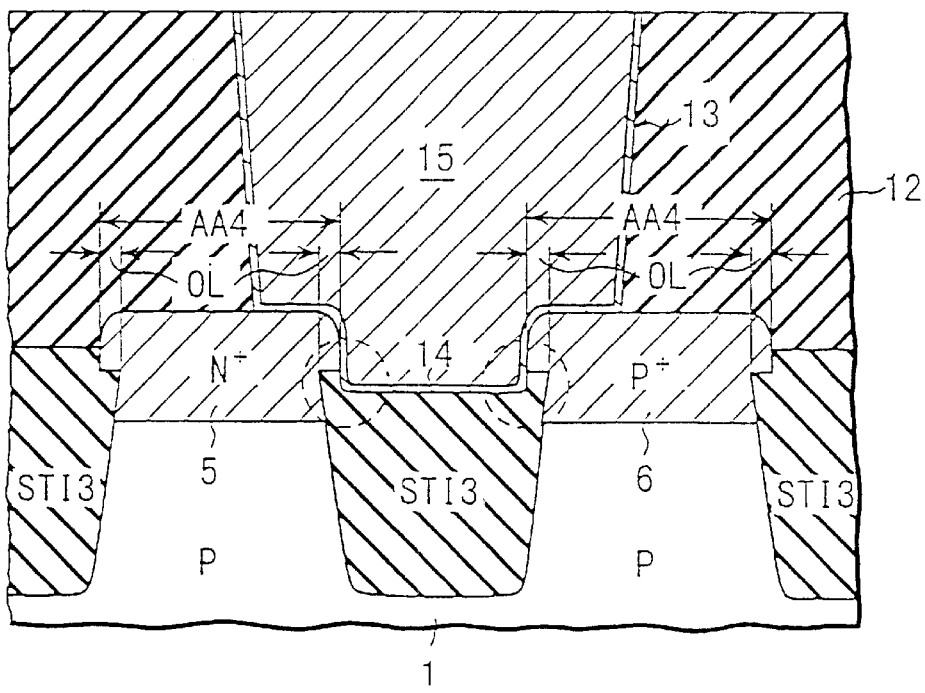
FIG. 2 is a cross-sectional view of a semiconductor integrated circuit device according to a first embodiment of the present invention.

FIG. 2 is a cross-sectional view of a semiconductor integrated circuit device according to the first embodiment of the present invention.

As shown in FIG. 2, a shallow trench isolation (STI) 3 is formed in a P-type silicon substrate 1. The STI 3 is an element isolation region for partitioning an active area into two active areas (AA) 4 for forming elements of a semiconductor device. FIG. 2 shows adjacent two active areas 4 between which the STI 3 is interposed. An $N^+$-type semiconductor region 5 is formed in one of the active areas 4, while a $P^+$-type semiconductor region 6 is formed in the other active area 4. For example, the $N^+$-type semiconductor region 5 is a source/drain region of an N-channel MOSFET, and the $P^+$-type semiconductor region 6 is that of a P-channel MOSFET. A first-level interlayer insulation film 12 is formed on the STI 3 and active areas 4, and an opening 13 is formed in the first-level interlayer insulation film 12. The STI 3 and semiconductor regions 5 and 6 are exposed to the bottom of the opening 13. A glue layer 14 is formed in the opening 13, and the opening 13 is filled with a conductor 15 which is electrically connected to the $N^+$- and $P^+$-type semiconductor regions 5 and 6 through the glue layer 14. The conductor 15 is LI wiring for connecting the regions 5 and 6 on the STI 3 and constituted of, e.g., tungsten (W). Since the glue layer 14 protects the semiconductor integrated circuit device from an acid caused when the tungsten is deposited, it contains an acid-resistant conductor such as titanium and titanium nitride.

According to the first embodiment described above, the active areas 4 are caused to overlap the STI 3. In FIG. 2, reference symbol OL denotes an overlap area. There is an insulator constituting the STI 3, e.g., $SiO_2$, under the area OL exposed from the opening 13, as circled by the broken line in FIG. 2.

In the semiconductor integrated circuit device so constituted, the glue layer 14 is opposed to the active areas 4 through the $SiO_2$ formed under the area OL. This $SiO_2$ has a function of inhibiting the material of the glue layer 14 from diffusing toward the active areas 4. Therefore, even though a defect is caused in the active areas 4 so as to extend over the PN junction, the material of the glue layer 14, such as titanium, becomes difficult to diffuse in the defect. Consequently, a Ti-silicide layer can be prevented from being formed through a PN junction and accordingly a junction leak can be prevented from increasing remarkably.

The foregoing semiconductor integrated circuit device according to the first embodiment can prevent a junction leak from increasing remarkably and thus decrease in power consumption. It can also prevent a malfunction of an integrated circuit due to a junction leak and improve in manufacturing yield. The requirements of low power consumption, high reliability and low cost can thus be satisfied simultaneously in the semiconductor integrated circuit device.

Second Embodiment

A preferred embodiment will now be described as a second embodiment of the present invention. Like the first embodiment, the second embodiment is directed to an example of LI wiring.

Hereinafter the second embodiment will be described together with its manufacturing method.

FIGS. 3A to 3G are cross-sectional views sequentially showing steps of manufacturing a semiconductor integrated circuit device according to the second embodiment of the present invention.

Figure 3A:
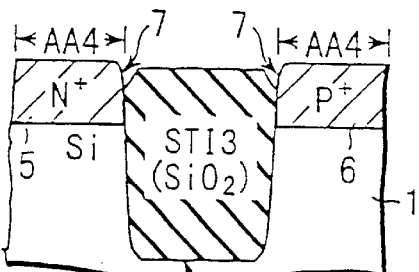
FIGS. 3A, 3B, 3C, 3D, 3E, 3F and 3G are cross-sectional views sequentially showing steps of manufacturing a semiconductor integrated circuit device according to a second embodiment of the present invention.

As shown in FIG. 3A, first, a shallow trench 2 is formed in a P-type silicon substrate 1 and then filled with silicon oxide ($SiO_2$) to form a shallow trench isolation (STI) 3. After that, a MOSFET is formed in each of active areas (AA) 4 using a well-known method. FIG. 3A shows a section of an $N^+$-type semiconductor region 5 serving as a source/drain region of an N-channel MOSFET and that of a $P^+$-type semiconductor region 6 serving as a source/drain region of a P-channel MOSFET. After the MOSFETs are formed, silicon (Si) is exposed to the STI 3 through the sides 7 of the active areas 4. This step is executed by wet-etching the STI 3 using ammonium fluoride ($NH_4F$).

Figure 3B:
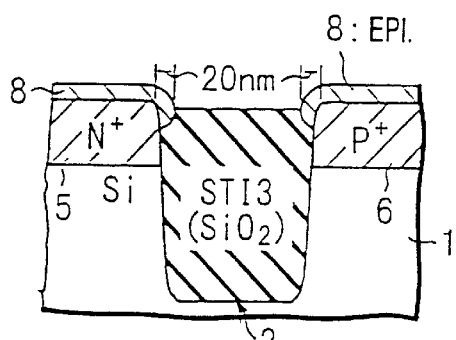

As illustrated in FIG. 3B, an epitaxial silicon layer 8 is formed on the surface of the exposed silicon by selective epitaxial growth (SEG). The thickness of the epitaxial silicon layer 8 is, for example, 20 nm. The layer 8 thus extends from the side of the active area 4 and overlaps the STI 3 by about 20 nm. It is preferable that an amount of overlap between the layer 8 and STI 3 be 20 nm or more; accordingly, it is preferable that the thickness of the layer 8 be 20 nm or more.

Figure 3C:
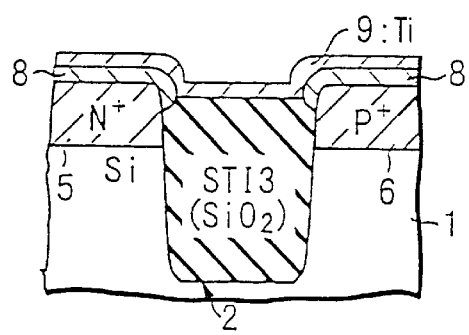

As shown in FIG. 3C, titanium (Ti) is deposited on the structure of FIG. 3B to form a titanium layer 9. The titanium layer 9 is formed in contact with the epitaxial silicon layer 8.

Figure 3D:
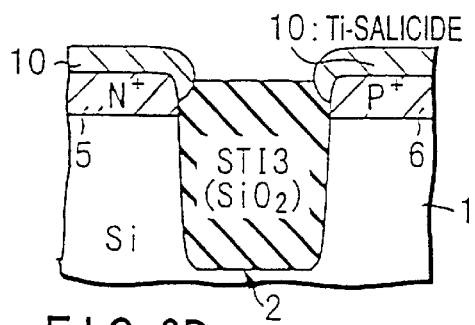

As shown in FIG. 3D, a Ti-silicide layer 10 is formed in self-alignment with at least the epitaxial silicon layer 8 using a self-alignment silicide technique (salicide technique). More specifically, the structure of FIG. 3C is heat-treated to cause the titanium layer 9 to react on the epitaxial silicon layer 8. Then, an unreacted portion of the titanium layer 9 is removed by acid processing. Thus, the Ti-silicide layer 10 is formed in self-alignment with at least the epitaxial silicon layer 8. Hereinafter the Ti-silicide layer 10 formed in self-alignment will be referred to as a Ti-salicide layer 10. The "salicide" is an abbreviation for "self-aligned silicide." In the present specification, the "salicide" is used according to idiomatic usage.

Since the Ti-salicide layer 10 is formed on at least on the epitaxial silicon layer 8, it overlaps the STI 3 by 20 nm or more.

Figure 3E:
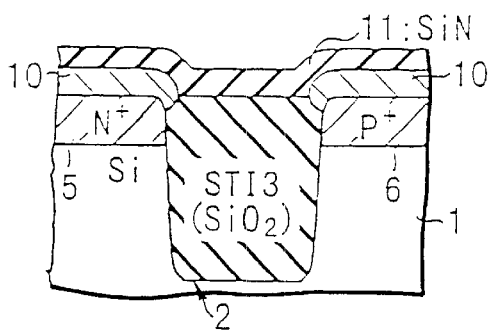

As shown in FIG. 3E, silicon nitride is deposited on the structure of FIG. 3D to form a silicon nitride (SiN) layer 11. The silicon nitride layer 11 is a stopper film for stopping etching when an opening is formed in a silicon oxide base film such as BPSG.

Figure 3F:
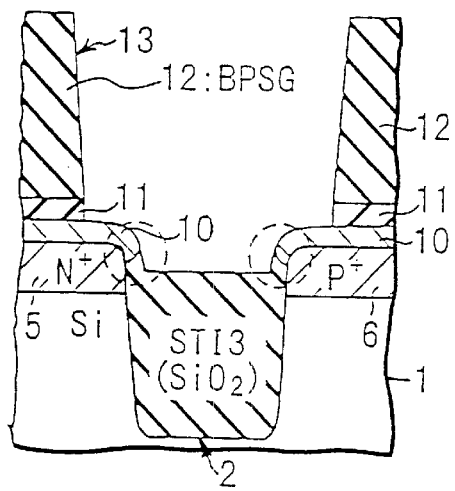

As illustrated in FIG. 3F, a silicon oxide base material such as BPSG, is deposited on the structure of FIG. 3E to form a first interlayer insulation film 12. A mask layer (not shown) having an opening corresponding to an LI wiring forming pattern is formed on the first interlayer insulation film 12 by photolithography. Using the mask layer as an etching mask, the first interlayer insulation film 12 and the silicon nitride film 11 are subjected to anisotropic etching in that order to form an LI wiring forming opening 13. When the silicon nitride film 11 is opened, the surface of the STI 3 ($SiO_2$) is slightly removed by anisotropic etching, as is that of the Ti-salicide layer 10. Since, however, the Ti-salicide layer 10 has a sufficient thickness especially in its overlap on the STI 3, that part of the STI 3 which underlies the Ti-salicide layer 10 is not subjected to anisotropic etching. As a result, the STI 3 remains between the side of each of the active areas 4 and the opening 13, as circled by the broken line in FIG. 3F, and no silicon is exposed from the opening 13 through the sides of the active areas 4.

Figure 3G:
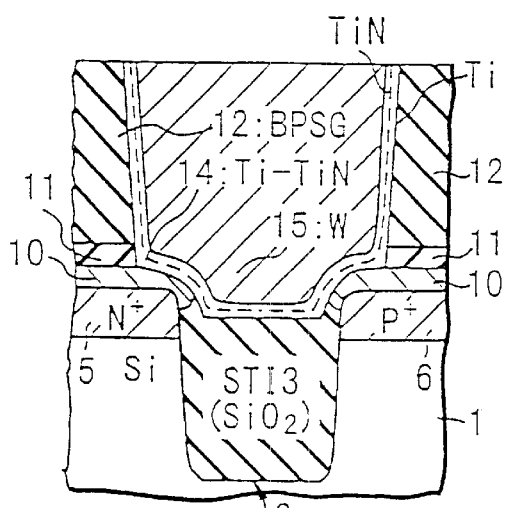

After the mask layer (not shown) is eliminated, as shown in FIG. 3G, a glue layer 14 is formed in the opening 13. The glue layer 14 is constituted of a layered film (Ti—TiN) of titanium and titanium nitride. The layered film is obtained by depositing titanium and then titanium nitride or depositing titanium and then nitriding the surface of a formed titanium layer. Tungsten (W) is then deposited and buried in the opening 13, thereby forming LI wiring 15.

In the foregoing semiconductor integrated circuit device according to the second embodiment, as circled by the broken line in FIG. 3G, the glue layer 14 is opposed to the active areas 4 through $SiO_2$ underlying the Ti-salicide layer 10 overlapping the STI 3 in the opening 13. Therefore, as in the first embodiment, the titanium of the glue layer 14 can be inhibited from diffusing into the active areas 4. Consequently, a Ti-silicide layer can be prevented from being formed through the PN junction and a junction leak can be prevented from increasing remarkably.

Third Embodiment

Like the first and second embodiments, a third embodiment of the present invention is directed to an example of LI wiring. The third embodiment will now be described together with its manufacturing method.

FIGS. 4A to 4H are cross-sectional views sequentially showing steps of manufacturing a semiconductor integrated circuit device according to the third embodiment of the present invention.

Figure 4A:
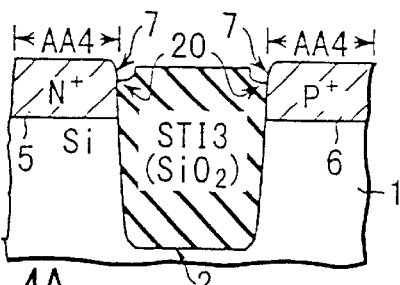
FIGS. 4A, 4B, 4C, 4D, 4E, 4F, 4G and 4H are cross-sectional views sequentially showing steps of manufacturing a semiconductor integrated circuit device according to a third embodiment of the present invention.

First, as shown in FIG. 4A, silicon (Si) is exposed to the sides 7 of active areas (AA) 4 by the method described above referring to FIG. 3A. In the third embodiment, however, the silicon is exposed by forming a hollow 20 in the STI 3 along each of the active areas 4.

Figure 4B:
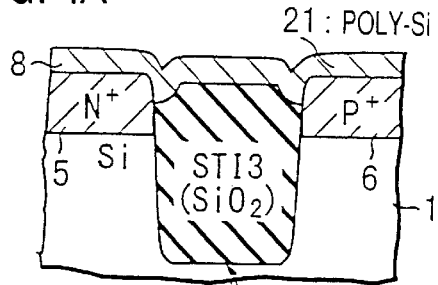

Then, as illustrated in FIG. 4B, silicon is deposited on the structure of FIG. 4A to form a polysilicon (Poly-Si) layer 21. The thickness of the layer 21 is, for example, 20 nm.

Figure 4C:
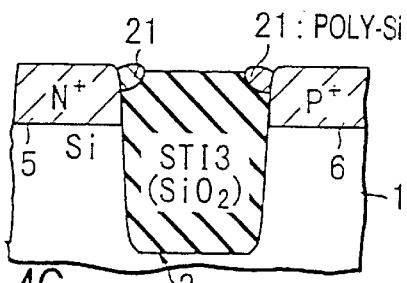

As shown in FIG. 4C, the polysilicon layer 21 is subjected to isotropic etching by CDE and left in the hollow 20. The layer 21 thus remains on the STI 3 in contact with the silicon through the sides of the active areas 4. It is preferable that the width of the polysilicon layer 21 remaining on the STI 3 be 20 nm or more; accordingly, it is preferable that the thickness of the layer 21 be 20 nm or more.

Figure 4D:
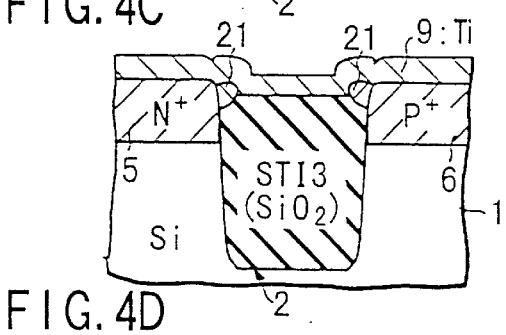

After that, as shown in FIG. 4D, a titanium layer 9 is formed on the structure of FIG. 4C by the method described above referring to FIG. 3C. In the third embodiment, the titanium layer 9 contacts $N^+$- and $P^+$-type regions 5 and 6 and the polysilicon layer 21.

Figure 4E:
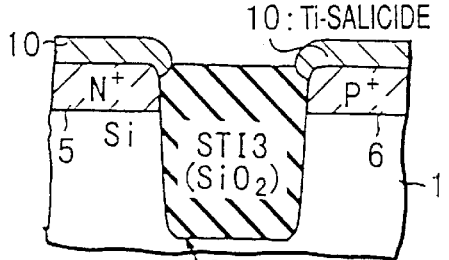

As illustrated in FIG. 4E, the structure of FIG. 4D is heat-treated to cause the titanium layer 9 to react on the $N^+$- and $P^+$-type regions 5 and 6 and polysilicon layer 21. Then, an unreacted portion of the titanium layer 9 is removed by acid processing. Thus, a Ti-salicide layer 10 is formed in self-alignment with the $N^+$- and $P^+$-type regions 5 and 6 and polysilicon layer 21. Since the Ti-salicide layer 10 is also formed on the polysilicon layer 21, it overlaps the STI 3 by 20 nm or more.

Figure 4F:
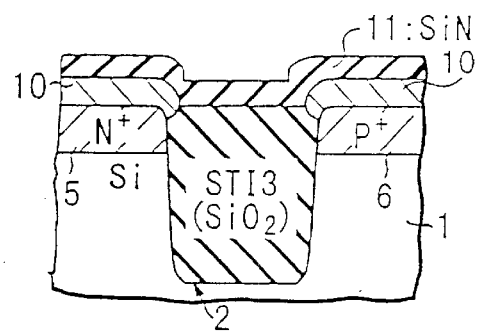

As illustrated in FIG. 4F, silicon nitride is deposited on the structure of FIG. 4E to form a silicon nitride (SiN) layer 11.

Figure 4G:
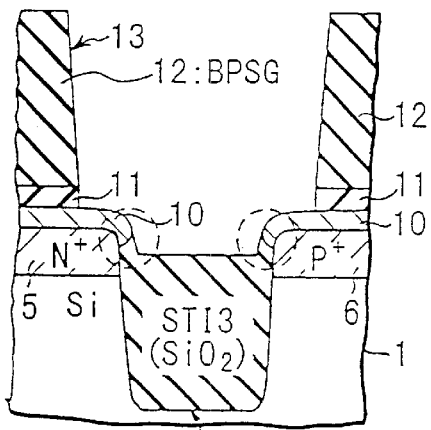

Then, as shown in FIG. 4G, a silicon oxide base material such as BPSG, is deposited on the structure of FIG. 4F to form a first interlayer insulation film 12. After that, an LI wiring forming opening 13 is formed in the first interlayer insulation film 12 and silicon nitride film 11 by the method described above referring to FIG. 3F. When the silicon nitride film 11 is opened, the surface of the STI 3 ($SiO_2$) is slightly removed by anisotropic etching, as is that of the Ti-salicide layer 10. However, in the third embodiment, too, the Ti-salicide layer 10 has a sufficient thickness especially in its overlap on the STI 3. As in the second embodiment, therefore, the STI 3 remains between the side of each of the active areas 4 and the opening 13, as circled by the broken line in FIG. 4G, and no silicon is exposed from the opening 13 through the sides of the active areas 4.

Figure 4H:
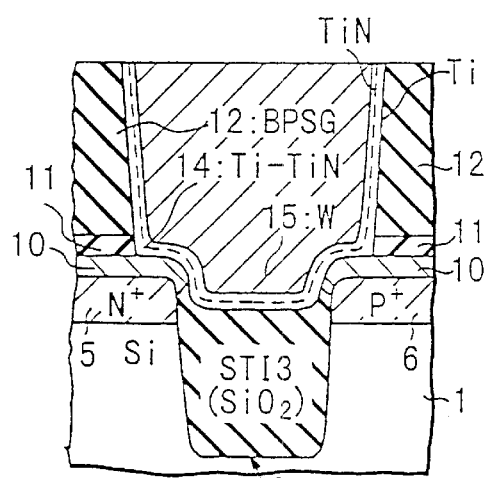

As shown in FIG. 4H, a glue layer 14 constituted of a layered film of titanium and nitride titanium, is formed in the opening 13 by the method described above referring to FIG. 3G, and tungsten (W) is buried in the opening 13 to form LI wiring 15.

In the foregoing semiconductor integrated circuit device according to the third embodiment, too, as circled by the broken line in FIG. 4H, the glue layer 14 is opposed to the active areas 4 through $SiO_2$ underlying the Ti-salicide layer 10 overlapping the STI 3 in the opening 13. Therefore, as in the first and second embodiments, the titanium of the glue layer 14 can be inhibited from diffusing into the active areas 4. Consequently, a Ti-silicide layer can be prevented from being formed through a PN junction and a junction leak can be prevented from increasing remarkably.

Fourth Embodiment

Like the first to third embodiments, a fourth embodiment of the present invention is directed to an example of LI wiring. The fourth embodiment will now be described together with its manufacturing method.

FIGS. 5A to 5F are cross-sectional views sequentially showing steps of manufacturing a semiconductor integrated circuit device according to the fourth embodiment of the present invention.

Figure 5A:
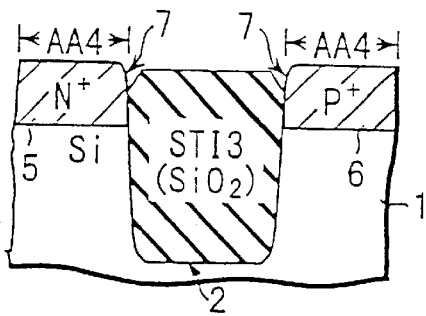
FIGS. 5A, 5B, 5C, 5D, 5E and 5F are cross-sectional views sequentially showing steps of manufacturing a semiconductor integrated circuit device according to a fourth embodiment of the present invention.

First, as illustrated FIG. 5A, silicon (Si) is exposed to an STI 3 through the sides 7 of active areas (AA) 4 by the method described above referring to FIG. 3A.

Figure 5B:
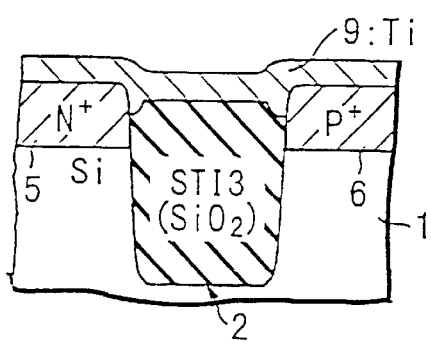

Then, as shown in FIG. 5B, a titanium layer 9 is formed on the structure of FIG. 5A. In the fourth embodiment, the titanium layer 9 contacts the top surfaces and the sides of $N^+$- and $P^+$-type regions 5 and 6.

Figure 5E:
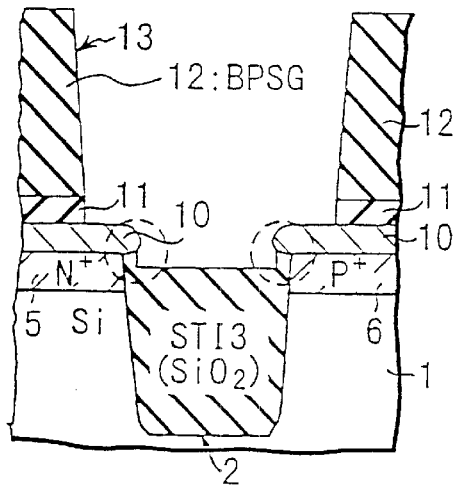
Figure 5C:
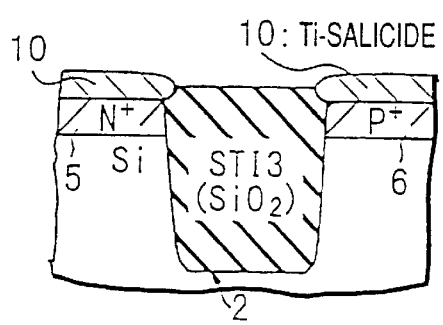

As shown in FIG. 5C, the structure of FIG. 5B is heat-treated to cause the titanium layer 9 to react on the $N^+$- and $P^+$-type regions 5 and 6. Then, an unreacted portion of the titanium layer 9 is removed by acid processing. Thus, a Ti-salicide layer 10 is formed in self-alignment with the $N^+$- and $P^+$-type regions 5 and 6. The layer 10 is also formed on the top surfaces and the sides of $N^+$- and $P^+$-type regions 5 and 6. It is preferable that the Ti-salicide layer 10 overlap the STI 3 by 20 nm or more and accordingly it is preferable that the thickness of the titanium 9 be 20 nm or more.

Figure 5D:
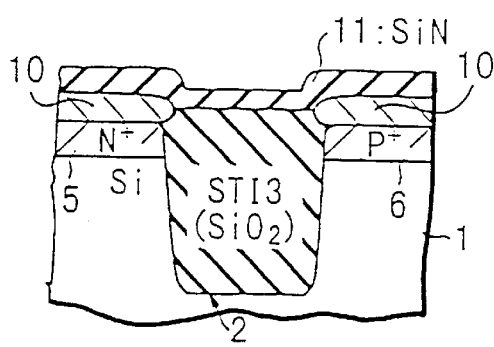

As illustrated in FIG. 5D, silicon nitride is deposited on the structure of FIG. 5C to form a silicon nitride (SiN) layer 11.

Then, as shown in FIG. 5E, a silicon oxide base material such as BPSG, is deposited on the structure of FIG. 5D to form a first interlayer insulation film 12. An LI wiring forming opening 13 is formed in the first interlayer insulation film 12 and silicon nitride film 11 by the method described above referring to FIG. 3F. When the silicon nitride film 11 is opened, the surface of the STI 3 ($SiO_2$) is slightly removed by anisotropic etching, as is that of the Ti-salicide layer 10. However, in the fourth embodiment, too, the Ti-salicide layer 10 has a sufficient thickness especially in its overlap on the STI 3. As in the first embodiment, therefore, the STI 3 remains between the side of each of the active areas 4 and the opening 13, as circled by the broken line in FIG. 5E, and no silicon is exposed from the opening 13 through the sides of the active areas 4.

Figure 5F:
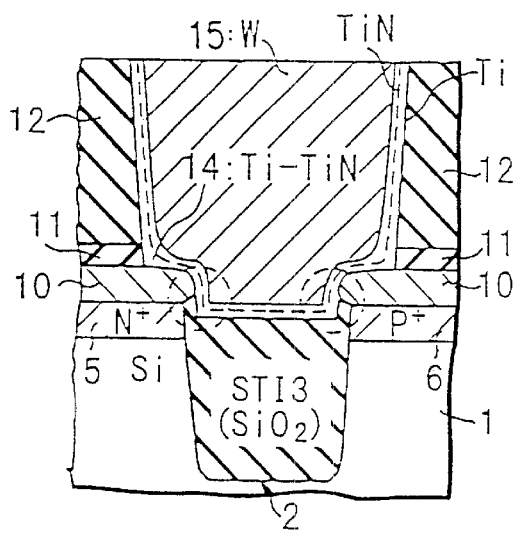

As shown in FIG. 5F, a glue layer (Ti—TiN layer) 14 is formed in the opening 13 by the method described above referring to FIG. 3G, and tungsten (W) is buried in the opening 13 to form LI wiring 15.

In the foregoing semiconductor integrated circuit device according to the fourth embodiment, too, as circled by the broken line in FIG. 5F, the glue layer 14 is opposed to the active areas 4 through $SiO_2$ underlying the Ti-salicide layer 10 overlapping the STI 3 in the opening 13. Therefore, as in the first to third embodiments, the titanium of the glue layer 14 can be inhibited from diffusing into the active areas 4. Consequently, a Ti-silicide layer can be prevented from being formed through the PN junction and a junction leak can be prevented from increasing remarkably.

Fifth Embodiment

In the first to fourth embodiments, the present invention is applied to an example of LI wiring. However, it can also be applied to a structure similar to the LI wiring. As such a structure, there is a fringe-less contact formed over a boundary between an active area 4 and a STI 3. The fringe-less contact is formed in an opening whose width is almost equal to or greater than that of the active area.

A fifth embodiment of the present invention is directed to an example of a fringe-less contact.

Figure 6:
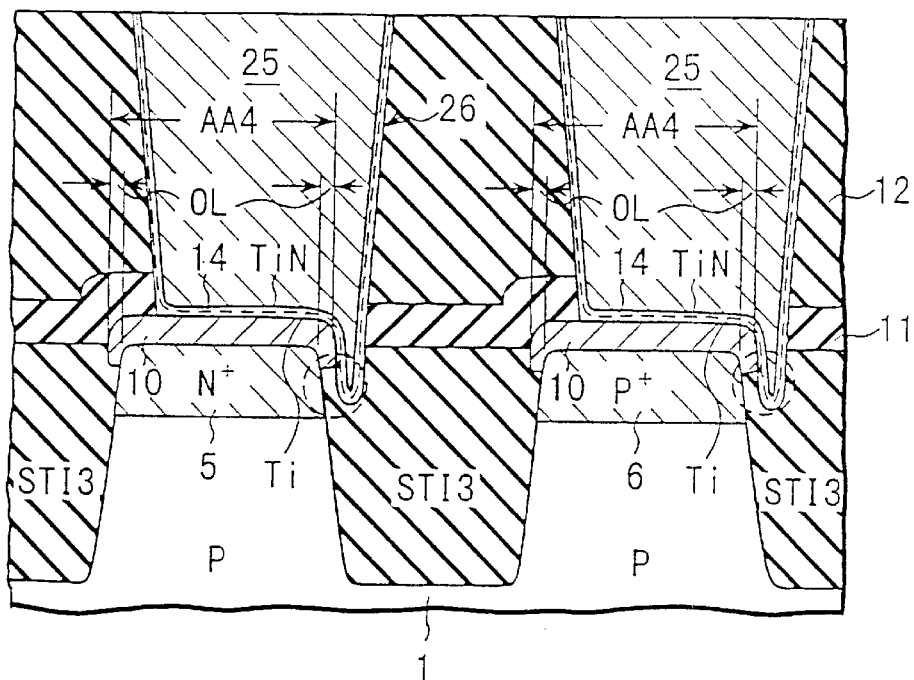
FIG. 6 is a cross-sectional view of a semiconductor integrated circuit device according to a fifth embodiment of the present invention.

FIG. 6 is a cross-sectional view showing a semiconductor integrated circuit device according to a fifth embodiment of the present invention.

As shown in FIG. 6, a fringe-less contact 25 is formed in an opening 26 whose width is almost equal to that of each of active areas 4. The opening 26 is thus likely to be formed over a boundary between each of the active areas 4 and STI 3 due to a misalignment caused in the lithographic process. This structure, which is shown in FIG. 6, is the same as that of LI wiring.

If, therefore, the present invention is applied to the fringe-less contact, titanium constituting a glue layer 14 can be inhibited from diffusing into the active area 4. Consequently, a Ti-silicide layer can be prevented from being formed through the PN junction and a junction leak can be prevented from increasing remarkably.

Sixth Embodiment

As a structure similar to the LI wiring, there is trench wiring as well as the fringe-less contact described above. The LI wiring of the first to fourth embodiments is a kind of trench wiring.

A sixth embodiment of the present invention is directed to an example of trench wiring for connecting $N^+$- and $P^+$-type semiconductor regions 5 and 6 to another region.

Figure 7:
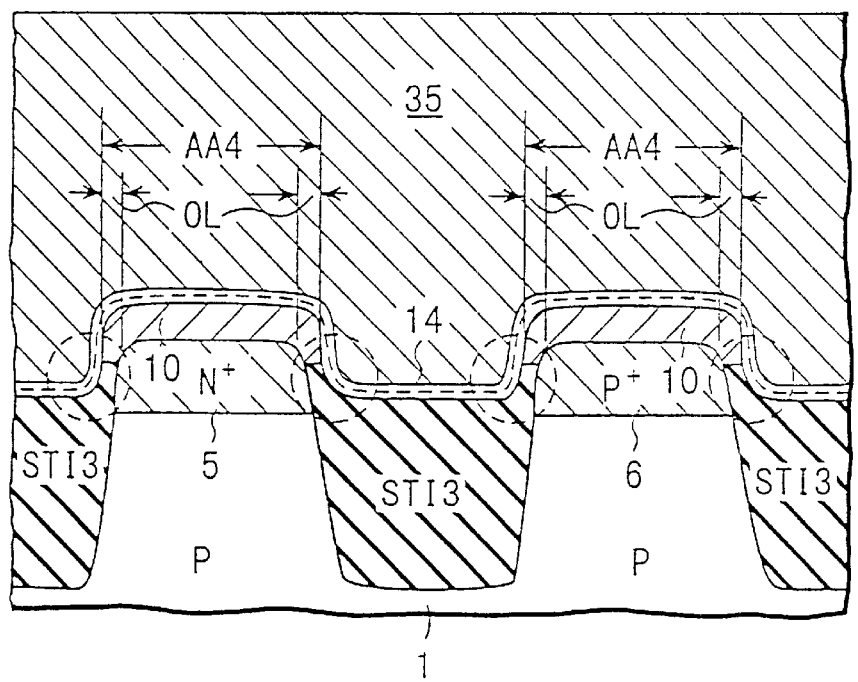
FIG. 7 is a cross-sectional view of a semiconductor integrated circuit device according to a sixth embodiment of the present invention.

FIG. 7 is a cross-sectional view of a semiconductor integrated circuit device according to the sixth embodiment.

As illustrated in FIG. 7, trench wiring 35 is formed in a trench formed in a direction crossing active areas 4, and contacts all the sections of the $N^+$- and $P^+$-type semiconductor regions 5 and 6. Such a structure is the same as that of the LI wiring of the first to fourth embodiments.

If, therefore, the present invention is applied to the trench wiring 35, the titanium constituting the glue layer 14 can be inhibited from diffusing into the active areas 4. Consequently, a Ti-silicide layer can be prevented from being formed through a PN junction and a junction leak can be prevented from increasing remarkably.

The present invention is not limited to the first to sixth embodiments described above. Various changes and modifications can be made without departing from the scope of the subject matter of the present invention.

For example, in the second to sixth embodiments, the salicide layer 10 is formed of titanium. However, it can be formed of a high melting point metal other than titanium, such as cobalt, in the field of semiconductor.

A salicide layer formed of titanium or cobalt is hard to expand sufficiently in its plane direction.

In the second embodiment, however, the epitaxial layer 8 is caused to overlap the STI 3, and the active areas 4 to be silicified are expanded in the plane direction.

In the third embodiment, the polysilicon layer 21 is buried in the hollows 20 formed in the STI 3 and the active areas 4 to be silicified are expanded in the plane direction.

In the fourth embodiment, the high melting point metal (titanium) layer 9 contacting the sides of the active areas 4, is caused to overlap the STI 3 to form a salicide layer so as to overlap the STI 3.

In the above embodiments, the salicide layer 10, which is expanded sufficiently in the plane direction, can be formed even by the use of titanium or cobalt. These embodiments are therefore advantageous to the formation of the salicide layer 10 using titanium or cobalt.

The glue layer 14 can be formed of not only titanium, titanium nitride, or a layered structure of titanium and titanium nitride, but also a conductor capable of protecting the semiconductor integrated circuit device from "acid" caused during the manufacturing process.

As has been described above, according to the present invention, there can be provided a semiconductor integrated circuit device having a structure capable of inhibiting a junction leak from increasing remarkably, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor comprising:

forming an element isolation region in a semiconductor substrate of a first conductivity type isolating an active area of a silicon semiconductor substrate;

forming a semiconductor region of a second conductivity type in the active area;

exposing a top surface and a side of the active area;

forming a silicon layer on the top surface and the side of the active area and overlapping the element isolation region by selective epitaxial growth;

forming an interlayer insulation film on the element isolation region and the silicon layer;

forming an opening to which the element isolation region, the silicon layer, and a boundary therebetween are exposed;

forming a glue layer in the opening; and forming a conductor electrically connected to the semiconductor region via the glue layer.

2. A method of manufacturing a semiconductor device comprising:

forming an element isolation region in a silicon semiconductor substrate of a first conductivity type isolating an active area in the semiconductor substrate;

forming a semiconductor region of a second conductivity type in the active area;

exposing a top surface of the active area;

forming in the element isolation region, a hollow to which a side of the active area is exposed;

burying silicon layer in the hollow;

forming an interlayer insulation film on the element isolation region and the silicon layer;

forming an opening to which the element isolation region, the silicon layer, and a boundary therebetween are exposed;

forming a glue layer in the opening; and forming a conductor electrically connected to the semiconductor region via the glue layer.

3. A method of manufacturing a semiconductor device comprising:

forming an element isolation region in a semiconductor substrate of a first conductivity type isolating an active area in the semiconductor substrate;

forming a semiconductor region of a second conductivity type in the active area;

causing the active area to overlap the element isolation region;

forming a metal layer at least on the active area after the active area is caused to overlap the element isolation region;

causing the metal layer to react on the active area to form a reaction layer of metal containing the metal layer and a semiconductor containing the active area;

removing an unreacted portion of the metal layer to leave the reaction layer on a surface of the semiconductor region of the second conductivity type formed in the active area;

forming an interlayer insulation film on the element isolation region and the reaction layer;

forming an opening to which the element isolation region, the reaction layer, and a boundary therebetween are exposed;

forming a glue layer in the opening; and forming a conductor electrically connected to the semiconductor region via the glue layer.

4. A method of manufacturing a semiconductor device comprising:

forming an element isolation region in a silicon semiconductor substrate of a first conductivity type isolating an active area in the semiconductor substrate;

forming a semiconductor region of a second conductivity type in the active area;

exposing a top surface and a side of the active area;

forming a silicon layer on the top surface and the side of the active area and overlapping the element isolation region by selective epitaxial growth;

forming a metal layer at least on the silicon layer;

causing the metal layer to react on the silicon layer to form a silicide layer;

removing an unreacted portion of the metal layer to leave the silicide layer on a surface of the semiconductor region of the second conductivity type formed in the active area;

forming an interlayer insulation film on the element isolation region and the silicide layer;

forming an opening to which the element isolation region, the silicide layer, and a boundary therebetween are exposed;

forming a glue layer in the opening; and forming a conductor electrically connected to the semiconductor region via the glue layer.

5. A method of manufacturing a semiconductor device comprising:

forming an element isolation region in a silicon semiconductor substrate of a first conductivity type isolating an active area in the semiconductor substrate;

forming a semiconductor region of a second conductivity type in the active area;

exposing a top surface of the active area;

forming in the element isolation region, a hollow to which a side of the active area is exposed;

burying silicon layer in the hollow;

forming a metal layer at least on the silicon layer and the active area;

causing the metal layer to react on the silicon layer and the active layer to form a silicide layer;

removing an unreacted portion of the metal layer to leave the silicide layer on a surface of the semiconductor region of the second conductivity type formed in the active area;

forming an interlayer insulation film on the element isolation region and the silicide layer;

forming an opening to which the element isolation region, the silicide layer, and a boundary therebetween are exposed;

forming a glue layer in the opening; and forming a conductor electrically connected to the semiconductor region via the glue layer.

6. A method of manufacturing a semiconductor device comprising:

forming an element isolation region in a semiconductor substrate isolating an active area in the substrate;

causing the active area to overlap the element isolation region;

forming a metal layer on the active area;

reacting the metal layer to the active area;

forming an interlayer insulation film on the element isolation region and a reaction layer of the metal layer;

forming an opening in the interlayer insulation film, the opening to which the element isolation region and the reaction layer are exposed;

forming a glue layer in the opening, and forming a conductor electrically connected to the active area via the glue layer.

7. The method according to claim 6, wherein causing the active area to overlap the element isolation region includes growing an epitaxial semiconductor layer from the active area to the isolation region.

8. The method according to claim 6, wherein the glue layer Contains an acid-resistant conductor.

9. The method according to claim 8, wherein the acid-resistant conductor contains at least one of titanium and titanium nitride.

10. The method according to claim 6, wherein the opening is a contact hole.

11. The method according to claim 6, wherein the opening is a wiring trench.

* * * * *